United States Patent
Saito

(12) 
(10) Patent No.: US 10,727,863 B2
(45) Date of Patent: Jul. 28, 2020

(54) DATA COMPRESSION DEVICE AND DATA COMPRESSION METHOD

(71) Applicant: RENESAS ELECTRONICS CORPORATION, Tokyo (JP)

(72) Inventor: Hirofumi Saito, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/371,942

(22) Filed: Apr. 1, 2019

(65) Prior Publication Data

US 2019/0326927 A1    Oct. 24, 2019

(30) Foreign Application Priority Data

Apr. 18, 2018  (JP) ................. 2018-079605

(51) Int. Cl.
*H03M 7/30* (2006.01)
*H03M 1/12* (2006.01)

(52) U.S. Cl.
CPC ............ *H03M 7/30* (2013.01); *H03M 1/126* (2013.01); *H03M 7/70* (2013.01); *H03M 1/129* (2013.01)

(58) Field of Classification Search
None
See application file for complete search history.

(56) References Cited

U.S. PATENT DOCUMENTS

2018/0325422 A1* 11/2018 Sokol ................. A62B 7/10
2019/0235484 A1*  8/2019 Ristovski .......... G05B 23/0283

FOREIGN PATENT DOCUMENTS

CN      102546497 B  *  6/2014
JP      10-42262 A        2/1998

* cited by examiner

*Primary Examiner* — Howard Williams
(74) *Attorney, Agent, or Firm* — McDermott Will & Emery LLP

(57) ABSTRACT

An object of the present invention is to efficiently compress a plurality of kinds of data series with different sampling rates. A data compression device has a grouping unit and a compression unit. The grouping unit groups a plurality of kinds of data series with different sampling rates. The compression unit compresses the data series grouped by the grouping unit.

14 Claims, 12 Drawing Sheets

DATA COMPRESSION DEVICE AND DATA COMPRESSION METHOD

CROSS-REFERENCE TO RELATED APPLICATIONS

The disclosure of Japanese Patent Application No. 2018-079605 filed on Apr. 18, 2018 including the specification, drawings and abstract is incorporated herein by reference in its entirety.

BACKGROUND

The present invention relates to a data compression device and a data compression method.

As a technique to compress time-series data, there is a compression technique for a video. For example, Japanese Unexamined Patent Application Publication No. Hei 10 (1998)-42262 discloses a compression device having a video codec unit and an audio codec unit. In general, video data that is time-series data with a first sampling rate (frame rate) and audio data that is time-series data with a second sampling rate are compressed by different codecs. That is, a compression process is performed for each data series having the same sampling rate.

SUMMARY

By the way, for example, in the case where time-series data to be compressed is sensing data about biological information, it is required to compress time-series data with different sampling rates obtained by a plurality of sensors in some cases. In the case where the above-described compression technique is used, it is necessary to perform a compression process for each of plural pieces of time-series data. Therefore, an efficient compression method has been required.

The other problems and novel features will become apparent from the description of the specification and the accompanying drawings.

According to an embodiment, a data compression device compresses data series obtained by grouping a plurality of kinds of data series with different sampling rates.

According to the embodiment, it is possible to efficiently compress a plurality of kinds of data series with different sampling rates.

DETAILED DESCRIPTION

In order to clarify the explanation, the following description and drawings are appropriately omitted and simplified. In addition, the same elements are followed by the same signs in each drawing, and the duplicated explanation thereof is omitted if needed.

Outline of Embodiments

Figure 1:
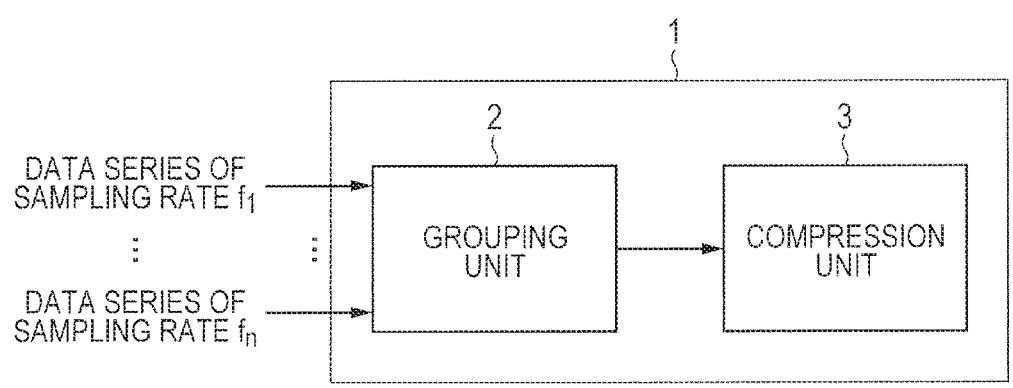
FIG. 1 is a block diagram for showing an example of a configuration of a data compression device according to an outline of an embodiment.

First, an outline of embodiments will be described prior to detailed explanation of the embodiments. FIG. 1 is a block diagram for showing an example of a configuration of a data compression device 1 according to an outline of the embodiments. The data compression device 1 has a grouping unit 2 and a compression unit 3.

A plurality of kinds of data series with different sampling rates is input to the data compression device 1. In the example shown in FIG. 1, n kinds of data series are input to the data compression device 1. It should be noted that n is an integer of 2 or more.

The grouping unit 2 groups a plurality of kinds of data series with different sampling rates. It is only necessary for the grouping unit 2 to unify at least two kinds of data series into one group. Therefore, the grouping unit 2 may unify all of n kinds of data series into one group. In addition, the grouping unit 2 may unify n kinds of data series into two or more groups. For example, the grouping unit 2 groups a data series that is sensing data about biological information. However, the kind of data is not limited to this.

The compression unit 3 compresses the data series grouped by the grouping unit 2.

As described above, the data compression device 1 compresses one data series obtained by grouping two or more data series with different sampling rates. Thus, it is not necessary to perform a compression process for each of data series with different sampling rates. Therefore, it is possible to efficiently compress a plurality of kinds of data series with different sampling rates.

Figure 2:
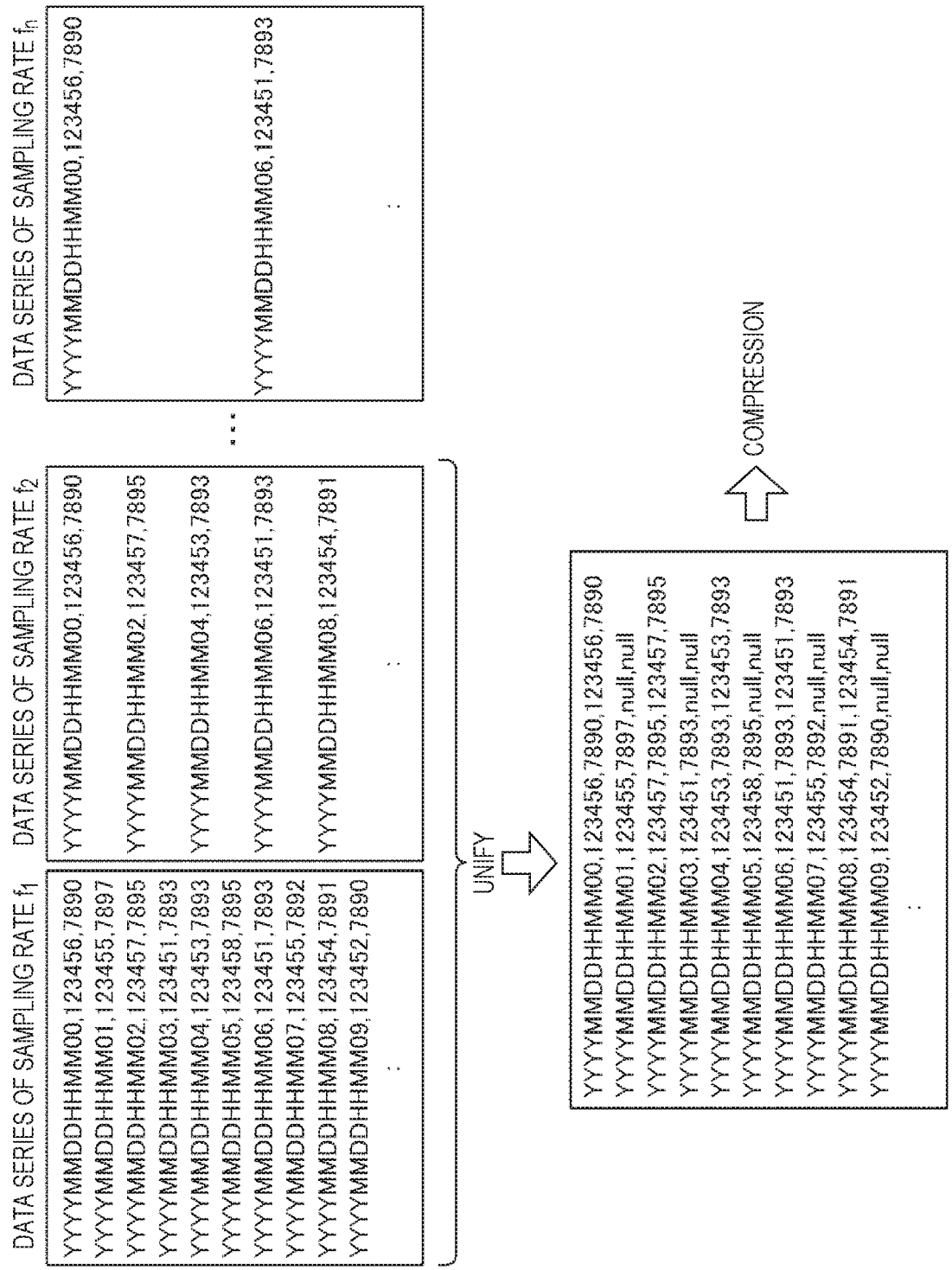
FIG. 2 is a schematic view for showing compression by the data compression device according to the embodiment.

FIG. 2 is a schematic view for showing compression by the data compression device. In FIG. 2, each sampling data contained in each data series is data obtained by combining information (specifically, for example, date and time information) indicating a timing (hereinafter, referred to as a sampling timing) at which sampling was performed with a sampling value. In FIG. 2, "YYYYMMDDHHMM00" or the like indicates the sampling timing, and information written on the right side of each sampling timing such as "123453,7893" or the like indicates the sampling value.

In the example shown in FIG. 2, the grouping unit 2 groups the data series of a sampling rate $f_1$ and the data series of a sampling rate $f_2$. The data series shown on the lower side in FIG. 2 are data series obtained by unifying these two data series. The data series are to be compressed by the compression unit 3. In the unified data series, duplicated information of the sampling timing is excluded. For example, both the data series of the sampling rate f1 and the data series of the sampling rate f2 contain the sampling data of the same sampling timing "YYYYMMDDHHMM00". That is, "YYYYMMDDHHMM00" is duplicated and written in two data series. On the contrary, in the data series obtained by unifying these two data series, the duplicated description "YYYYMMDDHHMM00" is excluded, and two sample values are associated with one sampling timing information as shown on the lower side of FIG. 2. Namely, in the case where a data series contains sampling timing information and a sampling value, one data series in which the duplicated sampling timing information existing among a plurality of data series is excluded can be obtained by grouping. Therefore, the compression unit 3 may compress the grouped data series in which duplicated information indicating a sampling timing is excluded. By doing so, the duplicated information can be excluded, and thus the compression rate can be improved. It should be noted that information is complemented by dummy data in the data series with two data series unified. In FIG. 2, "null" data is used as dummy data. However, this is an example, and other data may be used.

Hereinafter, embodiments will be described in detail.

First Embodiment

Figure 3:
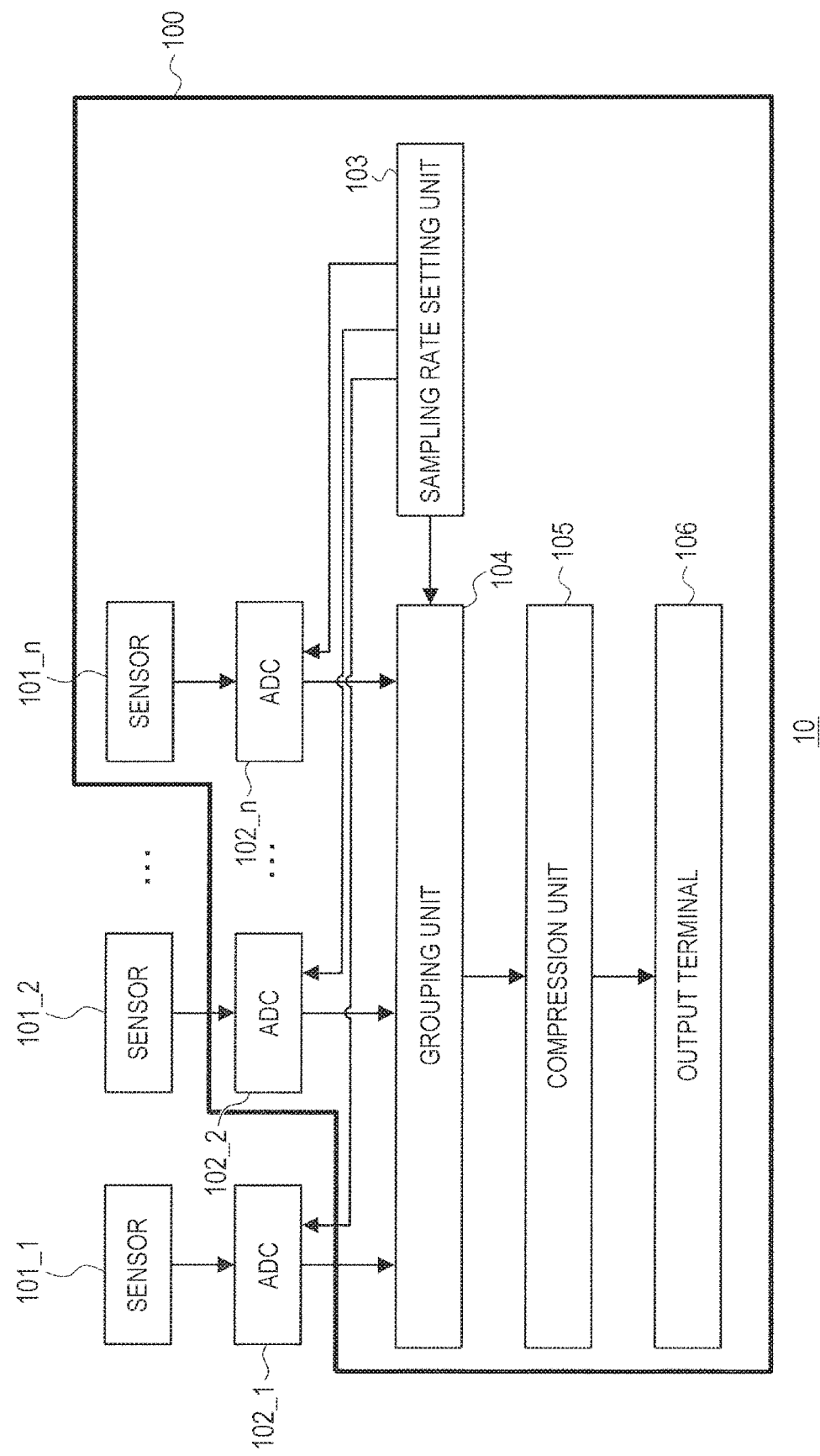
FIG. 3 is a block diagram for showing an example of a configuration of a data compression system according to an embodiment.

FIG. 3 is a block diagram for showing an example of a configuration of a data compression system 10 according to an embodiment. The data compression system 10 includes a microcomputer 100. The microcomputer 100 corresponds to the data compression device 1 of FIG. 1. The microcomputer 100 is a device that compresses data obtained from each of a plurality of sensors 101_1 to 101_n. It should be noted that the sensors 101_1 to 101_n will be referred to as a sensor 101 in the following description when the sensors 101_1 to 101_n are referred to without being particularly discriminated. An analog signal input from the sensor 101 is converted into a digital signal by an ADC (analog-to-digital converter). Therefore, the data compression system 10 includes ADCs 102_1 to 102_n. An analog signal output from the sensor 101_i (note that i is an integer of 1 or more and n or less) is converted into a digital signal by the ADC 102_i.

It should be noted that the following three modes are possible as relations among the microcomputer 100, the sensor 101, and the ADC 102 as shown in FIG. 3. However, as a configuration of the data compression system 10, any one of the configurations may be employed. In addition, a configuration obtained by arbitrarily combining these modes may be employed as a configuration of the data compression system 10.

The first mode is a mode in which a sensor and an ADC exist outside the microcomputer 100 as the sensor 101_1 and the ADC 102_1 of FIG. 3.

The second mode is a mode in which the microcomputer 100 includes a sensor and an ADC exists outside the microcomputer 100 as the sensor 101_2 and the ADC 102_2 of FIG. 3.

The third mode is a mode in which the microcomputer 100 includes a sensor and an ADC as the sensor 101_n and the ADC 102_n of FIG. 3.

In addition, the microcomputer 100 has a sampling rate setting unit 103, a grouping unit 104, a compression unit 105, and an output terminal 106. Here, the sampling rate setting unit 103, the grouping unit 104, and the compression unit 105 may be implemented by, for example, a software program including one or more commands. For example, the microcomputer 100 may include a processor and a memory, and the processor may execute a program stored in the memory to perform processes of the sampling rate setting unit 103, the grouping unit, and the compression unit 105.

Further, the above-described program can be stored and supplied to a computer using various types of non-transitory computer readable media. The non-transitory computer readable media include various types of tangible recording media. Examples of the non-transitory computer readable media include a magnetic recording medium (for example, a flexible disk, a magnetic tape, or a hard disk drive), a magneto-optical recording medium (for example, a magneto-optical disk), a CD-ROM (Read Only Memory), a CD-R, a CD-R/W, and a semiconductor memory (for example, a mask ROM, a PROM (Programmable ROM), an EPROM (Erasable PROM), a flash ROM, or a RAM (Random Access Memory)). Further, the program may be supplied to a computer by various types of transitory computer readable media. Examples of the transitory computer readable media include an electrical signal, an optical signal, and an electromagnetic wave. The program can be supplied to a computer by the transitory computer readable media via a wired communication path such as a wire or an optical fiber, or a wireless communication path.

It should be noted that the sampling rate setting unit 103, the grouping unit 104, and the compression unit 105 may execute a process using a hardware circuit or may execute a process using a configuration obtained by combining software with hardware.

The sampling rate setting unit 103 sets the sampling rate of the ADC 102. The sampling rate setting unit 103 sets a predetermined sampling rate for each measurement by the sensor 101 to the ADC 102. For example, sampling at a sampling rate $f_1$ is predetermined in a measurement by the sensor 101_1. Likewise, sampling at a sampling rate $f_i$ is predetermined in a measurement by the sensor 101_i. Thus, the sampling rate setting unit 103 sets the sampling rate $f_i$ to the ADC 102_i. Accordingly, the ADC 102 performs analog-digital conversion at the sampling rate set by the sampling rate setting unit 103. It should be noted that the sampling rate setting unit 103 notifies the grouping unit 104 of a predetermined sampling rate in order to determine a target grouped by the grouping unit 104.

The grouping unit 104 corresponds to the grouping unit 2 of FIG. 1, and groups a plurality of kinds of data series with different sampling rates output from the ADC 102 on the basis of a sampling rate. In the embodiment, specifically, the grouping unit 104 groups data series whose difference in the sampling rate is equal to or smaller than a predetermined threshold value. In other words, the grouping unit 104 groups the following first data series and second data series in the embodiment. The first data series is a data series obtained by being sampled at the first sampling rate, and the second data series is a data series obtained by being sampled at the second sampling rate. In addition, a difference between the first sampling rate and the second sampling rate is equal to or smaller than a predetermined threshold value. It should be noted that an arbitrary value can be set to the predetermined threshold value.

It should be noted that since the sampling rate is predetermined as described above, the grouping unit 104 can determine a target to be grouped before an actual measurement is started, that is, before inputting a data series is started. Therefore, it is possible to avoid generation of a processing load accompanied by grouping at the time of the measurement.

In addition, when inputting a data series is started, the grouping unit 104 creates one data series (hereinafter, referred to as an integrated data series) obtained by unifying the grouped data series. The integrated data series is a data series modeled on that sampled at a sampling rate $f_x$. The grouping unit 104 creates the data series with the sampling rate $f_x$ containing the sampling data of the first data series and the sampling data of the second data series by complementing dummy data. It should be noted that when the sampling rate of the first data series is assumed as $f_1$ and the sampling rate of the second data series is assumed as $f_2$ in this case, $f_x$ is the least common multiple of $f_1$ and $f_2$.

The compression unit 105 corresponds to the compression unit 3 of FIG. 1, and compresses one data series (integrated data series) obtained by unifying the data series grouped by the grouping unit 104. The compression unit 105 compresses the sampling data contained in the integrated data series on a predetermined number basis. It should be noted that the compression unit 105 performs, for example, Huffman compression as the compression process, but may perform the compression process using another compression algorithm. It should be noted that the compression unit 105 performs an arbitrary compression process for a data series that is not grouped.

The output terminal 106 is a terminal that outputs data compressed by the compression unit 105 to an external device. It should be noted that the data output from the output terminal 106 may be transmitted to another device through a transmission/reception circuit (not shown) using wired or wireless communications.

Figure 4:
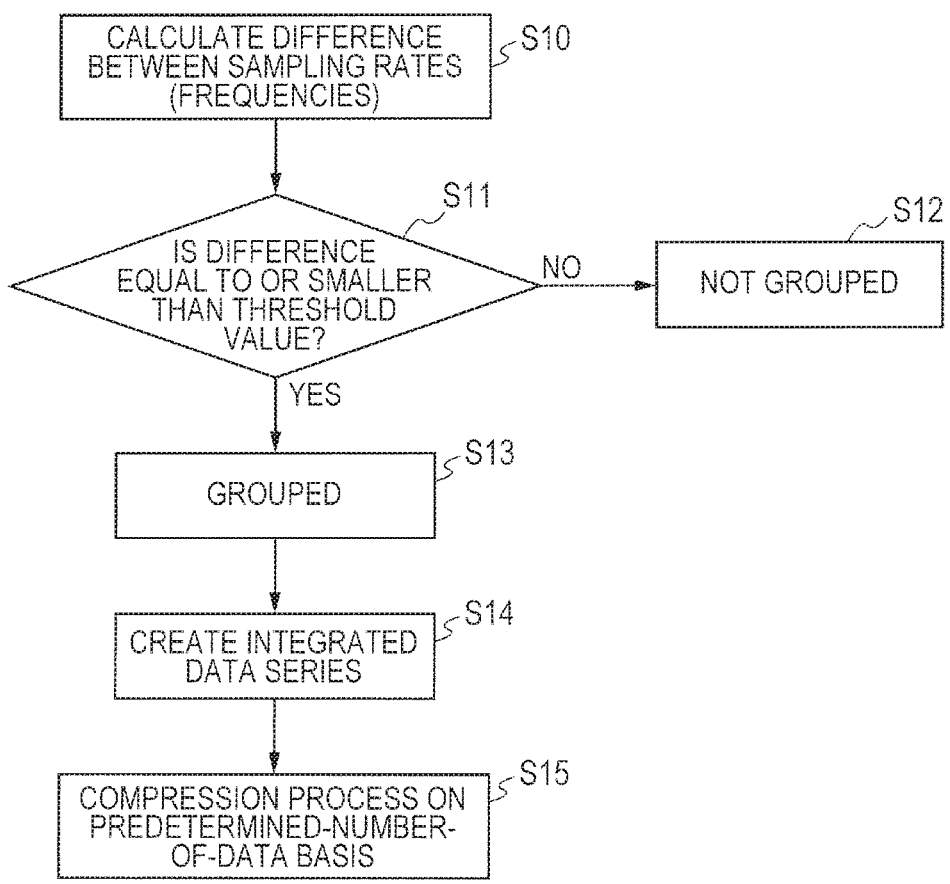
FIG. 4 is a flowchart for showing an example of an operation for grouping and compression according to a first embodiment.

FIG. 4 is a flowchart for showing an example of an operation for grouping and compression according to the first embodiment. Hereinafter, a flow of an operation for grouping and compression will be described with reference to FIG. 4.

In Step 10 (S10), the grouping unit 104 obtains a sampling rate (frequency) set to each ADC 102, that is, the sampling rate of each data series. Then, the grouping unit 104 calculates a difference between two sampling rates selected from the obtained sampling rates.

Next, the grouping unit 104 determines in Step 11 (S11) whether or not the difference calculated in Step 10 is equal to or smaller than a predetermined threshold value. In the case where the difference exceeds the predetermined threshold value, the grouping unit 104 determines that the combination of data series associated with the sampling rates whose difference is calculated in Step 10 is not a target to be grouped (Step 12 (S12)). In this case, the grouping unit 104 repeats Step 10 and Step 11 for other combinations.

On the contrary, in the case where the difference is equal to or smaller than the predetermined threshold value, the grouping unit 104 determines that the combination of data series associated with the sampling rates whose difference is calculated in Step 10 is a target to be grouped (Step 13 (S13)). That is, in this case, the grouping unit 104 determines to group the combination of data series.

It should be noted that the grouping unit 104 selects a set of data series first in the example shown here, and when a difference between the sampling rates of both the data series does not satisfy the condition, the grouping unit 104 tests other sets. However, the grouping unit 104 may search for a combination of data series that satisfies the condition using other procedures. For example, after calculating the differences among the sampling rates for all the combinations, the grouping unit 104 may extract a combination of data series with the smallest difference as a target to be grouped.

When inputting a data series is started, the grouping unit 104 creates, in Step 14 (S14), the integrated data series from a plurality of data series configuring the group determined in Step 13.

Then, the compression unit 105 compresses sampling data contained in the integrated data series on a predetermined-number-of-data basis in Step 15 (S15).

Figure 5:
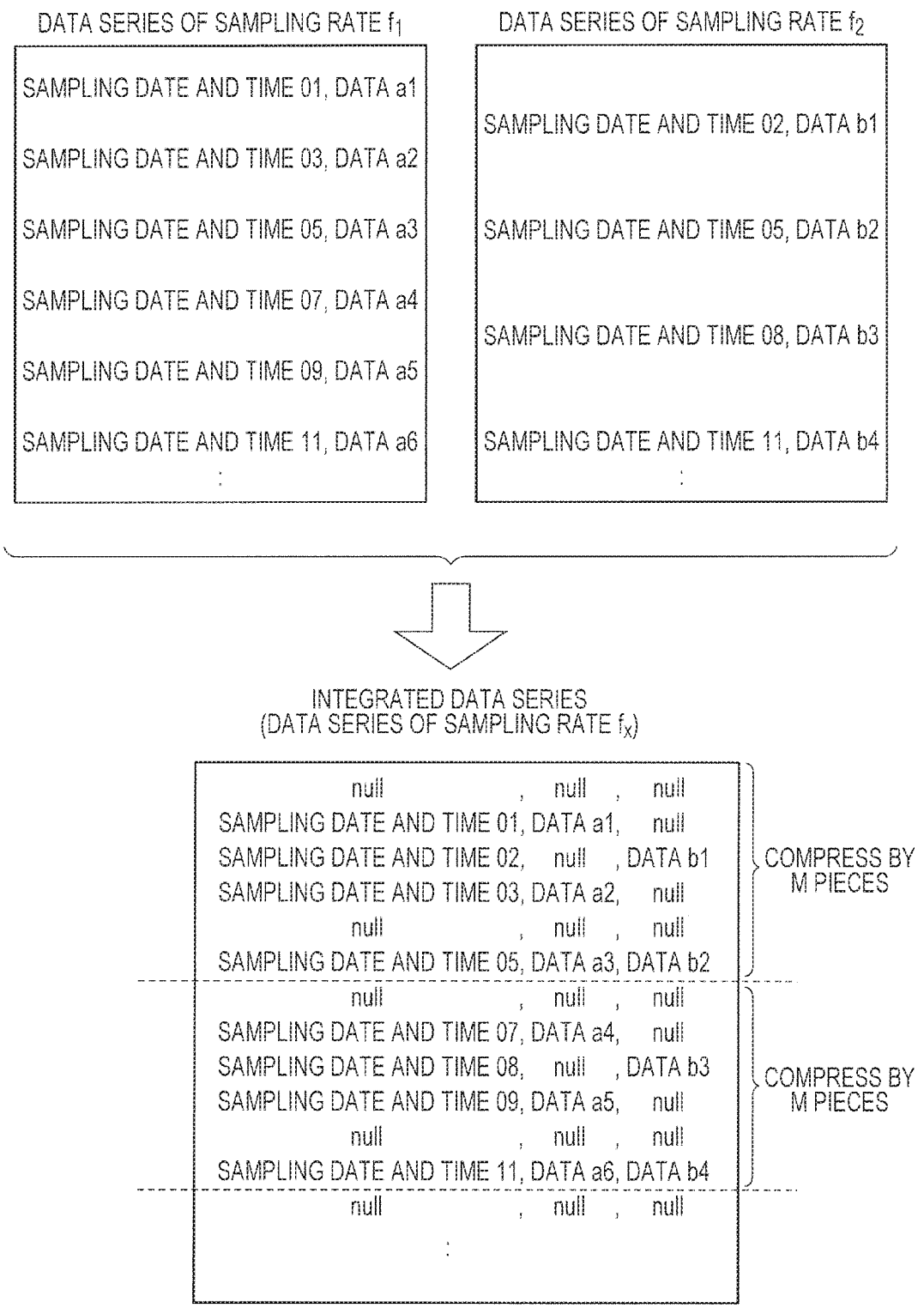
FIG. 5 is a schematic view for explaining generation of an integrated data series.

FIG. 5 is a schematic view for explaining generation of the integrated data series. In FIG. 5, the upper stage shows data series to be grouped by the grouping unit 104. That is, in the example shown in FIG. 5, the grouping unit 104 has determined to unify the data series of the sampling rate $f_1$ and the data series of the sampling rate $f_2$ into one group. In FIG. 5, the lower stage shows integrated data series generated from these data series. As described above, the integrated data series is a data series modeled on that sampled at the sampling rate $f_x$. In addition, $f_x$ is the least common multiple of $f_1$ and $f_2$. In FIG. 5, specifically, $f_1$, $f_2$, and $f_x$ are, for example, 3 Hz, 2 Hz, and 6 Hz, respectively.

As shown in FIG. 5, the grouping unit 104 embeds dummy data to complement data that cannot be obtained from the data series to be grouped, and creates the integrated data series. It should be noted that arbitrary data can be used as the dummy data. For example, the dummy data may be a string of characters such as "null" that does not essentially exist in the data series, or may be a value such as zero (0) that is extremely low in possibility of existing in the data series. In addition, the previous value (that is, the latest data that is actual data in the past) may be utilized as the dummy data.

The compression unit 105 compresses the sampling data of the integrated data series on an M-piece basis. That is, the compression unit 105 compresses M pieces of sampling data of the integrated data series, and then compresses the next M pieces of sampling data. Here, M is a value that is N times $f_x$, and N is an integer equal to or larger than 1. In FIG. 5, an example of N=1 is shown. N is a preliminarily-set value, and an arbitrary value can be set.

It should be noted that a unit of the compression process can be defined as follows. When the number of pieces of sampling data in one cycle of the repeated patterns (arrangement patterns of the dummy data) of the complemented dummy data is m, M is a value that is N times of m. It should be noted that m is 6 and N is 1 in the example shown in FIG. 5.

The arrangement patterns (arrangement patterns of the dummy data) of the actual data in the sampling data group to be compressed can be kept constant by performing the compression process using such a unit. In the example shown in FIG. 5, the actual data contained in the data series of the sampling rate $f_1$ always exists at each of the second, fourth, and sixth positions in the sampling data group to be compressed. Likewise, the actual data contained in the data series of the sampling rate $f_2$ always exists at each of the third and sixth positions in the sampling data group to be compressed. Therefore, a decoding device decoding each compression data sequentially output from the compression unit 105 can easily discriminate the actual data from the dummy data. Namely, for example, even if a part of the compression data among those sequentially output from the compression unit 105 cannot be transmitted to the decoding device, the actual data can be appropriately obtained in the transmitted compression data that follows.

It should be noted that as the value N becomes larger, there is a possibility that the compression efficiency can be improved because the data can be compressed all together.

On the other hand, an effect (data loss) caused by a lack of the compression data becomes greater.

By the way, the number of pieces of dummy data added when creating one data series by unifying those to be grouped affects the compression rate. That is, as a ratio of the dummy data contained in the integrated data series becomes smaller, it is possible to efficiently compress the data. In addition, when a difference between two small sampling rates such as 2 Hz and 3 Hz is small, the value of the least common multiple of these values is expected to be small. In the case where the least common multiple is large, there is a possibility that the number (that is, m) of pieces of sampling data in one cycle of the repeated patterns of the dummy data becomes large. When the value m becomes larger, the number of pieces of dummy data to be added becomes larger. Thus, there is a risk that a ratio of the dummy data is increased. In the embodiment, the data series in which a difference between the sampling rates is equal to or smaller than a threshold value are to be grouped, so that a group of data series in which the value of the least common multiple is relatively small is extracted. Therefore, a ratio of the dummy data in the integrated data series can be expected to be suppressed in the embodiment. It should be noted that the value of the least common multiple cannot be necessarily suppressed to be small in the case where the values of the sampling rates are large in the embodiment. However, a load of calculation for determination of grouping can be suppressed as compared to a second embodiment to be described later.

Second Embodiment

As described above, even if a difference between the sampling rates is small, the value of the least common multiple does not necessarily become small. For example, in the case where the sampling rate of one data series is 2 Hz and the sampling rate of the other data series is 3 Hz, a difference between the sampling rates is 1, and the least common multiple is 6. However, in the case where the sampling rate of one data series is 100 Hz and the sampling rate of the other data series is 99 Hz, a difference between the sampling rates is 1, but the least common multiple is 9900. Therefore, there is a risk that a ratio of the dummy data becomes large in the case where the sampling rates are large in the first embodiment.

Accordingly, a combination of data series to be grouped is determined by another method in the embodiment. Hereinafter, the configuration and operation of the microcomputer 100 that are different from those in the first embodiment will be described, but explanation of the configuration and operation thereof that are the same as those in the first embodiment will be omitted.

A grouping unit 104 in the embodiment groups data series in which a difference between the least common multiple of the sampling rates and the sampling rates whose least common multiple is to be calculated is equal to or smaller than a predetermined threshold value. In other words, the grouping unit 104 groups the following first data series and second data series in the embodiment. The first data series is a data series obtained by being sampled at a first sampling rate, and the second data series is a data series obtained by being sampled at a second sampling rate. In addition, a difference between the least common multiple of the first sampling rate and the second sampling rate and the first sampling rate is equal to or smaller than a predetermined threshold value, and a difference between the least common multiple and the second sampling rate is also equal to or smaller than the predetermined threshold value. It should be noted that an arbitrary value can be set as the predetermined threshold value.

As described above, the least common multiple is actually calculated, and the data series are to be grouped in the case where the least common multiple is small in the embodiment. It should be noted that in the case where the sampling rates are large, the least common multiple naturally becomes large. Thus, the least common multiple is not simply compared with the threshold value in the embodiment, but the magnitude of the least common multiple is determined on the basis of the magnitudes of the sampling rates on the basis of which the least common multiple is calculated. Accordingly, a combination of sampling rates whose least common multiple is extremely large on the basis of the magnitudes of the sampling rates can be excluded from targets to be grouped. Thus, a ratio of the dummy data in the integrated data series can be further expected to be suppressed in the embodiment.

As described above, the second embodiment is different from the first embodiment in that the method of determining a target to be grouped by the grouping unit 104 is different. However, the other configurations and operations are the same as those in the first embodiment.

Figure 6:
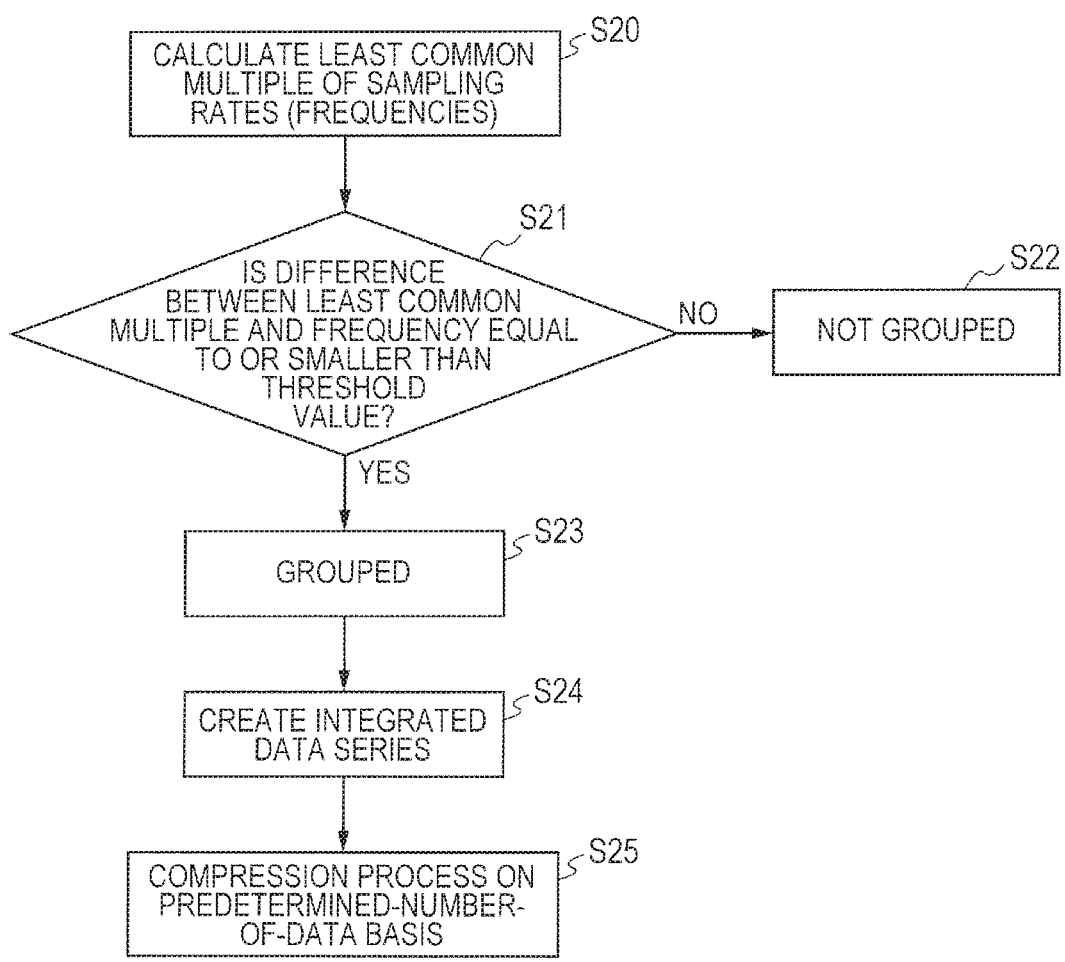
FIG. 6 is a flowchart for showing an example of an operation for grouping and compression according to a second embodiment.

FIG. 6 is a flowchart for showing an example of an operation for grouping and compression according to the second embodiment. Hereinafter, a flow of an operation for grouping and compression in the second embodiment will be described with reference to FIG. 6.

In Step 20 (S20), the grouping unit 104 obtains a sampling rate (frequency) set to each ADC 102, that is, the sampling rate of each data series. Then, the grouping unit 104 calculates the least common multiple of two sampling rates selected from the obtained sampling rates.

Next, the grouping unit 104 determines in Step 21 (S21) whether or not the least common multiple calculated in Step 20 satisfies a predetermined condition. Specifically, the grouping unit 104 determines whether or not a difference between the least common multiple calculated in Step 20 and the sampling rate (frequency) on the basis of which the least common multiple is calculated is equal to or smaller than a predetermined threshold value. For example, it is assumed that the least common multiple $LCM_{12}$ of a sampling rate $f_1$ and a sampling rate $f_2$ is calculated. In this case, the grouping unit 104 determines whether or not both of a difference $d_1$ between $LCM_{12}$ and $f_1$ and a difference $d_2$ between $LCM_{12}$ and $f_2$ are equal to or smaller than a predetermined threshold value. It should be noted that the grouping unit 104 may determine whether or not the larger one between $d_1$ and $d_2$ is equal to or smaller than a predetermined threshold value.

In the case where a difference between the least common multiple and each sampling rate exceeds the threshold value, the grouping unit 104 determines that a combination of the data series corresponding to the sampling rates whose least common multiple is calculated in Step 20 is not a target to be grouped (Step 22 (S22)). In this case, the grouping unit 104 repeats Step 20 and Step 21 for other combinations.

On the contrary, in the case where a difference between the least common multiple and each sampling rate is equal to or smaller than the predetermined threshold value, the grouping unit 104 determines that a combination of the data series corresponding to the sampling rates whose least common multiple is calculated in Step 20 is a target to be grouped (Step 23 (S23)). That is, in this case, the grouping unit 104 determines to group the combination of data series.

When inputting a data series is started, the grouping unit 104 creates, in Step 24 (S24), the integrated data series from a plurality of data series configuring the group determined in Step 23.

Then, the compression unit 105 compresses sampling data contained in the integrated data series on a predetermined-number-of-data basis in Step 25 (S25).

Figure 7:
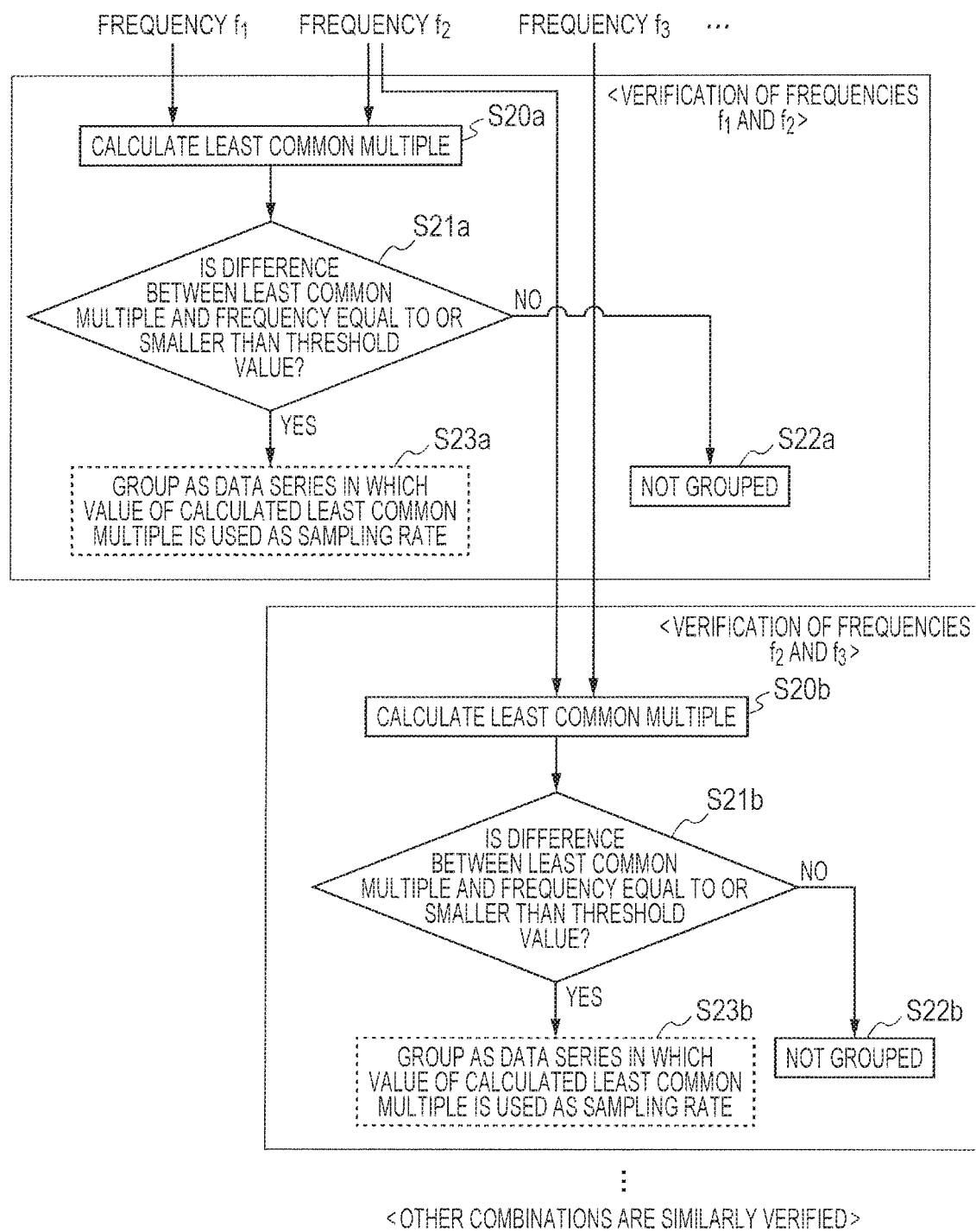
FIG. 7 is a flowchart for showing an example of an operation for grouping according to the second embodiment.

In the above-described example, the grouping unit 104 selects a set of data series first. In the case where the least common multiple of the sampling rates thereof does not satisfy a condition, the grouping unit 104 verifies whether or not another set can be grouped. FIG. 7 is a flowchart for showing an example of a flow of such a process.

In the example shown in FIG. 7, the least common multiple of a frequency $f_1$ and a frequency $f_2$ is calculated first (Step 20a (S20a)). Next, it is confirmed whether or not both a difference between the least common multiple and $f_1$ and a difference between the least common multiple and $f_2$ are equal to or smaller than a threshold value (Step 21a (S21a)). Here, it is assumed that the difference exceeds the threshold value. In this case, a determination (Step 22a (S22a)) that $f_1$ and $f_2$ are not grouped is made. Namely, a determination (Step 23a (S23a)) to group $f_1$ and $f_2$ is not made.

Next, the least common multiple of the frequency $f_2$ and a frequency $f_3$ is calculated (Step 20b (S20b)). Next, it is confirmed whether or not both a difference between the least common multiple and $f_2$ and a difference between the least common multiple and $f_3$ are equal to or smaller than a threshold value (Step 21b (S21b)). Here, it is assumed that the difference exceeds the threshold value. In this case, a determination (Step 22b (S22b)) that $f_2$ and $f_3$ are not grouped is made. Namely, a determination (Step 23b (S23b)) to group $f_2$ and $f_3$ is not made. Thereafter, other combinations are similarly verified.

It should be noted that the grouping unit 104 may search for a combination of data series that satisfies the condition using other procedures. For example, after calculating the least common multiples of the sampling rates for all the combinations, the grouping unit 104 may extract a combination that satisfies the condition as a target to be grouped.

In addition, the grouping unit 104 may repeat the grouping by further adding other kinds of data series with different sampling rates to a plurality of kinds of grouped data series. By doing so, three or more data series can be compressed into one data series all together.

Figure 8:
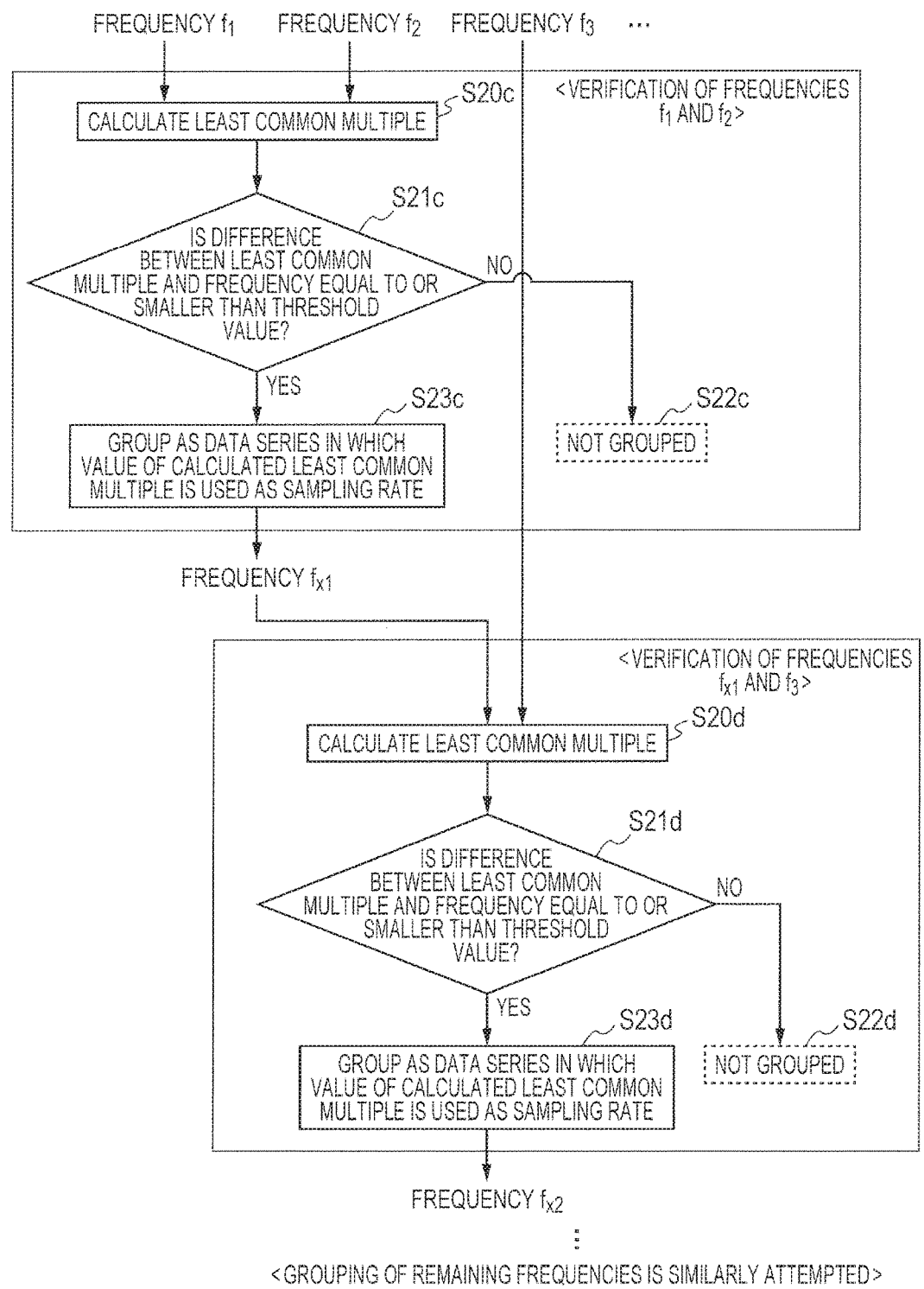
FIG. 8 is a flowchart for showing an example of an operation for grouping according to the second embodiment.

FIG. 8 is a flowchart for showing an example of a flow of such a process. In the example shown in FIG. 8, the least common multiple of the frequency $f_1$ and the frequency $f_2$ is calculated first (Step 20c (S20c)). Next, it is confirmed whether or not both a difference between the least common multiple and $f_1$ and a difference between the least common multiple and $f_2$ are equal to or smaller than a threshold value (Step 21c (S21c)). Here, it is assumed that the difference is equal to or smaller than the threshold value. In this case, a determination (Step 23c (S23c)) to group $f_1$ and $f_2$ is made. That is, it is determined to group the data series of the sampling rate $f_1$ and the data series of the sampling rate $f_2$ as the integrated data series in which the value ($f_{x1}$) of the calculated least common multiple is used as the sampling rate. Thus, a determination (Step 22c (S22c)) that $f_1$ and $f_2$ are not grouped is not made.

Next, the least common multiple of the frequency $f_{x1}$ and the frequency $f_3$ is calculated (Step 20d (S20d)). Next, it is confirmed whether or not both a difference between the least common multiple and $f_{x1}$ and a difference between the least common multiple and $f_3$ are equal to or smaller than a threshold value (Step 21d (S21d)). Here, it is assumed that the difference is equal to or smaller than the threshold value. In this case, a determination (Step 23d (S23d)) to group $f_{x1}$ and $f_3$ is made. That is, it is determined to group the data series of the sampling rate $f_1$, the data series of the sampling rate $f_2$, and the data series of the sampling rate $f_3$ into one as the integrated data series in which the value ($f_{x2}$) of the calculated least common multiple is used as the sampling rate. Thus, a determination (Step 22d (S22d)) that $f_{x1}$ and $f_3$ are not grouped is not made. Thereafter, grouping the data series of the remaining frequencies is similarly attempted.

It should be noted that an example of grouping in which data series are added to the existing group has been shown in the second embodiment. However, it is obvious that data series may be added to the existing group to be grouped in the first embodiment.

Figure 9:
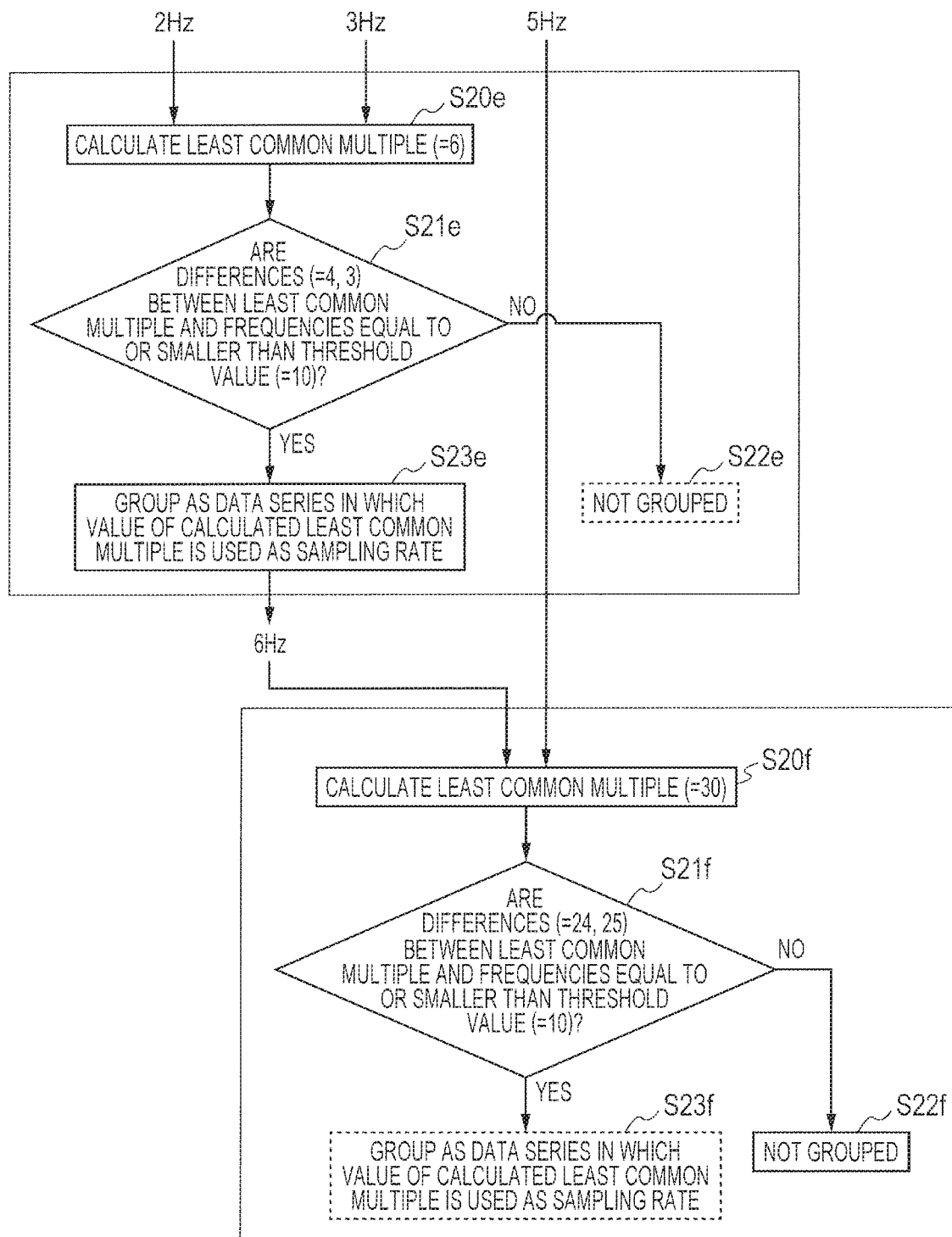
FIG. 9 is a flowchart for showing a concrete operation example of grouping according to the second embodiment.

Next, a flow of grouping in the second embodiment will be described using a concrete example. FIG. 9 is a flowchart for showing a concrete operation example of grouping according to the second embodiment. In the example shown in FIG. 9, data series having sampling rates of 2 Hz, 3 Hz, and 5 Hz are input to the microcomputer 100. It should be noted that a threshold value is 10. Hereinafter, a flow of grouping will be described with reference to FIG. 9.

First, 6 is obtained as the least common multiple of 2 Hz and 3 Hz (Step 20e (S20e)). Next, it is confirmed that both a difference (=4) between 6 and 2 and a difference (=3) between 6 and 3 are equal to or smaller than the threshold value (=10) (Step 21e (S21e)). Therefore, a determination (Step 23e (S23e)) to group the 2 Hz data series and the 3 Hz data series is made. That is, it is determined to group the two data series as the integrated data series in which 6 Hz is used as the sampling rate. Thus, a determination (Step 22e (S22e)) that the two data series are not grouped is not made (Step 22e (S22e)).

Next, 30 is obtained as the least common multiple of 6 Hz and 5 Hz (Step 20f (S20f)). Next, it is confirmed that a difference (=24) between 30 and 6 and a difference (=25) between 30 and 5 exceed the threshold value (=10) (Step 21f (S21f)). Therefore, it is determined that the 5 Hz data series are not added to the group determined in Step 23e (Step 22f (S22f)). In other words, a determination (Step 23f (S23f)) to add the 5 Hz data series to the group determined in Step 23e is not made.

Figure 10:
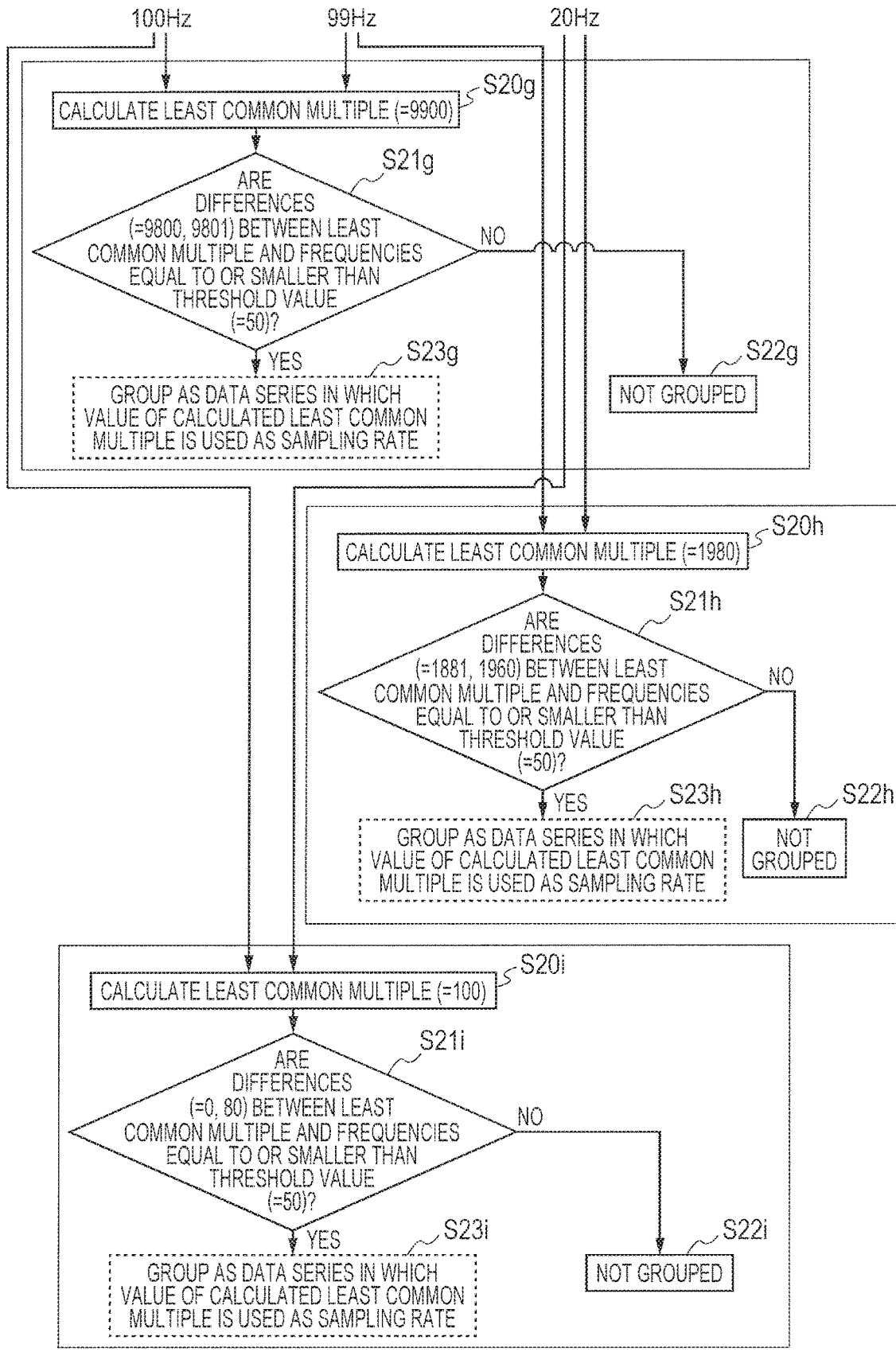
FIG. 10 is a flowchart for showing a concrete operation example of grouping according to the second embodiment.

Next, a flow of grouping in the second embodiment will be described using another concrete example. FIG. 10 is a flowchart for showing a concrete operation example of grouping according to the second embodiment. In the example shown in FIG. 10, data series having sampling rates of 100 Hz, 99 Hz, and 20 Hz are input to the microcomputer 100. It should be noted that a threshold value is 50. Hereinafter, a flow of grouping will be described with reference to FIG. 10.

First, 9900 is obtained as the least common multiple of 100 Hz and 99 Hz (Step 20g (S20g)). Next, it is confirmed that a difference (=9800) between 9900 and 100 and a difference (=9801) between 9900 and 99 exceed the threshold value (=50) (Step 21g (S21g)). Therefore, a determination (Step 22g (S22g)) that the 100 Hz data series and the 99 Hz data series are not grouped is made. Namely, a determination (Step 23g (S23g)) to group is not made.

Next, 1980 is obtained as the least common multiple of 99 Hz and 20 Hz (Step 20h (S20h)). Next, it is confirmed that a difference (=1881) between 1980 and 99 and a difference (=1960) between 1980 and 20 exceed the threshold value (=50) (Step 21h (S21h)). Therefore, a determination (Step 22h (S22h)) that the 99 Hz data series and the 20 Hz data series are not grouped is made. Namely, a determination (Step 23h (S23h)) to group is not made.

Next, 100 is obtained as the least common multiple of 100 Hz and 20 Hz (Step 20i (S20i)). Next, it is confirmed that a difference (=0) between 100 and 100 is equal to or smaller than the threshold value (=50) and a difference (=80) between 20 and 100 exceeds the threshold value (=50) (Step 21i (S21i)). Therefore, a determination (Step 22i (S22i)) that the 100 Hz data series and the 20 Hz data series are not grouped is made. Namely, a determination (Step 23i (S23i)) to group is not made.

Thus, the integrated data series is not created in the example shown in FIG. 10.

Third Embodiment

The embodiment is different from the above-described embodiments in that the sampling rate is changed to perform the grouping. That is, the sampling rate setting unit 103 sets sampling rates predetermined by a user via a program or the like to the ADC 102 in the above-described embodiments. On the contrary, sampling rates different from the predetermined sampling rates are set to the ADC 102 to perform the grouping if needed in the embodiment. Hereinafter, the configuration and operation of the microcomputer 100 that are different from those in the above-described embodiments will be described, but explanation of the configuration and operation thereof that are the same as those in the above-described embodiments will be omitted.

In the embodiment, in the case where the sampling rate setting unit 103 receives a request from the grouping unit 104, the sampling rate setting unit 103 sets not the predetermined sampling rates but sampling rates designated by the grouping unit 104 to the ADC 102.

In the embodiment, in the case where the least common multiple does not satisfy the above-described condition using a threshold value, the grouping unit 104 verifies again whether or not a sampling rate obtained by being shifted from the value of the original sampling rate satisfies the condition. In the case where the sampling rate obtained by being shifted from the value of the original sampling rate satisfies the condition, the grouping unit 104 notifies the sampling rate setting unit 103 to perform sampling at the shifted sampling rate. That is, the grouping unit 104 of the embodiment changes the sampling rate so that the least common multiple satisfies the condition using a threshold value.

It should be noted that the grouping unit 104 changes the sampling rate by raising the same. In the case where the sampling rate is lowered, the measurement accuracy is deteriorated. On the contrary, the sampling rate is raised when being changed in the embodiment, and thus it is possible to suppress a deterioration in measurement accuracy caused by the change. It should be noted that the grouping unit 104 may change the sampling rate by lowering the same.

The grouping unit 104 changes the sampling rate within a predetermined change range. For example, in the case where the least common multiple of a sampling rate $f_1$ to be set to the ADC 102_1 and a sampling rate $f_2$ to be set to the ADC 102_2 does not satisfy the condition, the grouping unit 104 changes one of the sampling rates by a predetermined shift width. For example, in the case where the predetermined change range is from 0 to 10 and the predetermined shift width is 1, the grouping unit 104 verifies whether or not the condition using a threshold value is satisfied when the sampling rate for the ADC 102_1 is changed to $(f_1+1)$ Hz.

That is, the grouping unit 104 verifies whether or not the least common multiple of $f_1+1$ and $f_2$ satisfies the condition using a threshold value. In the case where the condition is not satisfied, the grouping unit 104 verifies again by changing the sampling rate for the ADC 102_1 to $(f_1+2)$ Hz. The change of the sampling rate and the verification of the condition are repeated within the predetermined change range unless the condition is satisfied. It should be noted that the grouping unit 104 may change both the sampling rates at the same time.

In the case where the condition is satisfied, the grouping unit 104 notifies the sampling rate setting unit 103 to set the changed sampling rate to the ADC 102.

Figure 11:
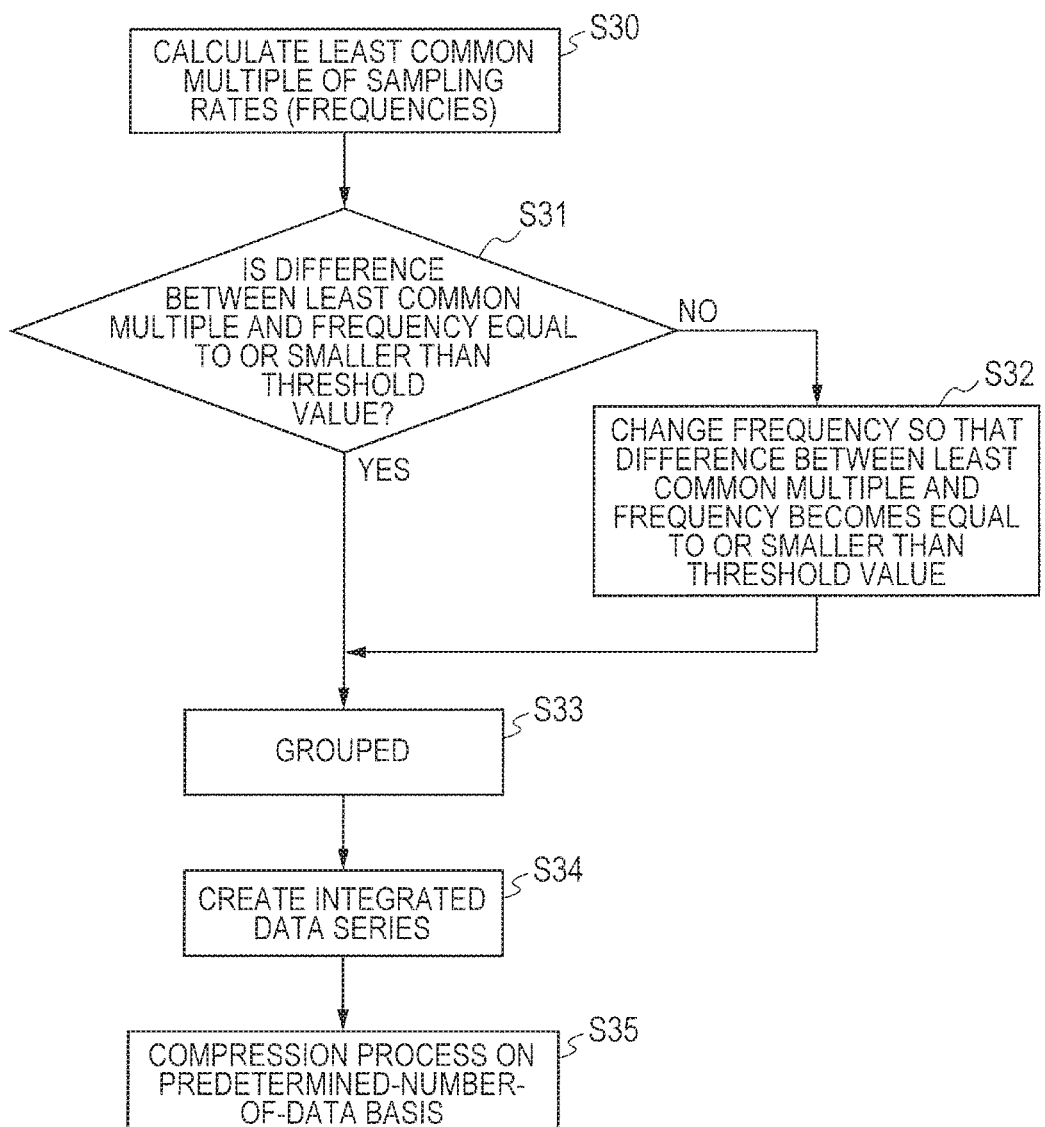
FIG. 11 is a flowchart for showing an example of an operation for grouping and compression according to a third embodiment.

FIG. 11 is a flowchart for showing an example of an operation for grouping and compression according to the third embodiment. Hereinafter, a flow of an operation for grouping and compression in the third embodiment will be described with reference to FIG. 11.

In Step 30 (S30), the grouping unit 104 obtains a sampling rate (frequency) to be set to each ADC 102. In addition, the grouping unit 104 calculates the least common multiple of two sampling rates selected from the obtained sampling rates.

Next, in Step 31 (S31), the grouping unit 104 determines whether or not the least common multiple calculated in Step 30 satisfies a predetermined condition. Specifically, the grouping unit 104 determines whether or not a difference between the least common multiple calculated in Step 30 and the sampling rate (frequency) on the basis of which the least common multiple is calculated is equal to or smaller than a predetermined threshold value. For example, it is assumed that the least common multiple of a sampling rate for the ADC 102_1 and a sampling rate for the ADC 102_2 are calculated. In this case, the grouping unit 104 determines whether or not both a difference between the least common multiple and the sampling rate for the ADC 102_1 and a difference between the least common multiple and the sampling rate for the ADC 102_2 are equal to or smaller than a predetermined threshold value.

In the case where a difference between the least common multiple and the sampling rate exceeds a threshold value, the grouping unit 104 changes the sampling rate so that the difference between the least common multiple and the sampling rate becomes equal to or smaller than the threshold value (Step 32 (S32)). That is, the grouping unit 104 changes the sampling rate for the ADC 102_1 or the sampling rate for the ADC 102_2 so that a difference between the least common multiple and the sampling rate for the ADC 102_1 becomes equal to or smaller than a predetermined threshold value and a difference between the least common multiple and the sampling rate for the ADC 102_2 becomes equal to or smaller than the predetermined threshold value.

The grouping unit 104 notifies the sampling rate setting unit 103 of the changed sampling rate. In addition, the grouping unit 104 records the change of the sampling rate into, for example, a storage device such as a memory. By recording the change history in such a manner, it is possible to easily confirm that the measurement is performed at a sampling rate different from that expected in the initial stage.

In the case where the difference between the least common multiple and the sampling rate satisfies the condition, the grouping unit 104 determines that a combination of the data series measured at each sampling rate determined to satisfy the condition is a target to be grouped (Step 33 (S33)). That is, in this case, the grouping unit 104 determines to group the combination of these data series.

When inputting the data series is started, the process of Step 34 (S34) is performed. It should be noted that in the case where the sampling rate is changed, the data series of the changed sampling rate is input as described above. In Step 34, the grouping unit 104 creates the integrated data series from a plurality of data series configuring the group determined in Step 33.

Then, the compression unit 105 compresses sampling data contained in the integrated data series a predetermined-number-of-data basis in Step 35 (S35).

Figure 12:
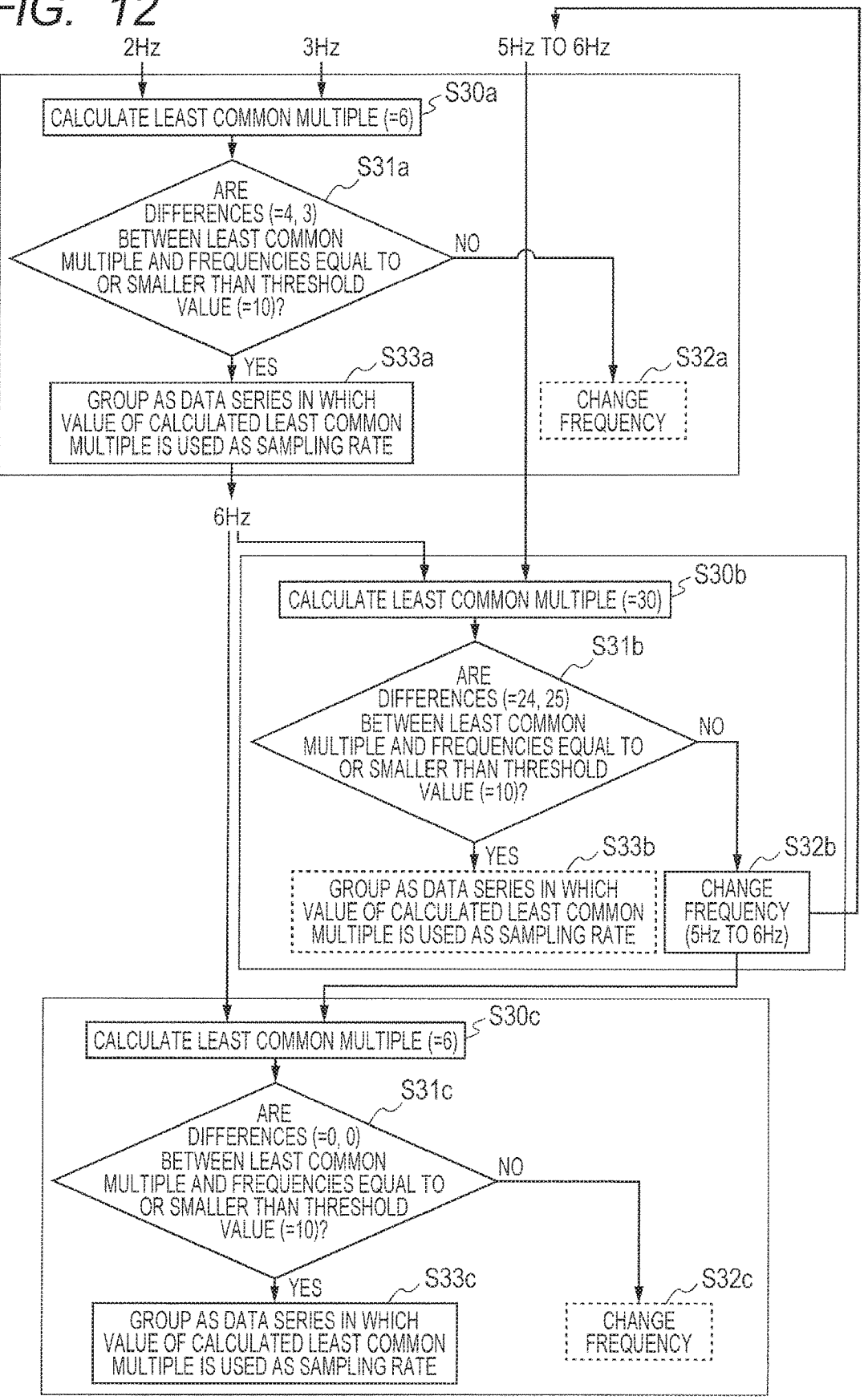
FIG. 12 is a flowchart for showing a concrete operation example of grouping according to the third embodiment.

Next, a flow of grouping in the third embodiment will be described using a concrete example. FIG. 12 is a flowchart for showing a concrete operation example of grouping according to the third embodiment. In the example shown in FIG. 12, grouping at sampling rates of 2 Hz, 3 Hz, and 5 Hz is planned in the initial stage. It should be noted that a threshold value is 10. Hereinafter, a flow of grouping will be described with reference to FIG. 12.

First, 6 is obtained as the least common multiple of 2 Hz and 3 Hz (Step 30a (S30a)). Next, it is confirmed that both a difference (=4) between 6 and 2 and a difference (=3) between 6 and 3 are equal to or smaller than the threshold value (=10) (Step 31a (S31a)). Therefore, a determination (Step 33a (S33a)) to group the 2 Hz data series and the 3 Hz data series is made. That is, it is determined to group the two data series as the integrated data series in which 6 Hz is used as the sampling rate. Thus, a change (Step 32a (S32a)) of the sampling date (frequency) is not made.

Next, 30 is obtained as the least common multiple of 6 Hz and 5 Hz (Step 30b (S30b)). Next, it is confirmed that a difference (=24) between 30 and 6 and a difference (=25) between 30 and 5 exceed the threshold value (=10) (Step 31b (S31b)). Therefore, a determination (Step 33b (S33b)) to add the 5 Hz data series to the group determined in Step 33a is not made. Instead, the sampling rate (frequency) is changed in Step 32b (S32b). For example, here, the grouping unit 104 changes the sampling rate that is 5 Hz in the initial stage into 6 Hz.

Next, it is verified whether or not the condition is satisfied by the change. Specifically, the following operation is performed. First, the least common multiple of the sampling rate obtained as a result of Step 33a and the sampling rate changed in Step 32b is obtained in Step 30c (S30c). That is, 6 is obtained as the least common multiple of 6 Hz and 6 Hz. Next, a difference between the sampling rate used in the calculation of the least common multiple and the least common multiple is compared with the threshold value. That is, it is confirmed that both a difference (=0) between 6 and 6 and a difference (=0) between 6 and 6 are equal to or smaller than the threshold value (=10) (Step 31c (S31c)). Therefore, a determination (Step 33c (S33c)) to add the 6 Hz data series to the groups of the 2 Hz data series and the 3 Hz data series is made. That is, it is determined to group the three data series as the integrated data series in which 6 Hz is used as the sampling rate. Thus, an additional change (Step 32c (S32c)) of the sampling rate (frequency) is not made.

The sampling rate is changed in the embodiment as described above. Therefore, even in the case where the data series cannot be grouped using the sampling rate in the initial stage, it is possible to group the data series.

The invention achieved by the inventors has been concretely described above on the basis of the embodiments. However, it is obvious that the present invention is not limited to the above-described embodiments, and can be variously changed without departing from the scope thereof.

What is claimed is:

1. A data compression device comprising:
   a grouping circuit configured to group a plurality of kinds of data series with different sampling rates; and
   a compression circuit configured to compress the data series grouped by the grouping circuit,
   wherein the grouping circuit is configured to group a first data series obtained by being sampled at a first sampling rate and a second data series obtained by being sampled at a second sampling rate, and
   wherein a difference between the least common multiple of the first sampling rate and the second sampling rate and the first sampling rate is equal to or smaller than a predetermined threshold value, and a difference between the least common multiple and the second sampling rate is equal to or smaller than the predetermined threshold value.

2. The data compression device according to claim 1, wherein the grouping circuit is configured to group a first data series sampled at a sampling rate f1 and a second data series sampled at a sampling rate f2, and creates a data series with a sampling rate fx containing sampling data of the first data series and sampling data of the second data series by complementing dummy data,
   wherein the compression circuit is configured to compress the sampling data of the created data series by M pieces, and
   wherein fx is the least common multiple of f1 and f2, M is a value that is N times fx, and N is an integer of 1 or more.

3. The data compression device according to claim 1, wherein the grouping circuit is further configured to repeat the grouping by further adding other kinds of data series with different sampling rates to the grouped data series.

4. The data compression device according to claim 1, wherein the data series includes sampling timing information that is information indicating a timing at which a sampling was performed and a sampling value, and
   wherein the grouping circuit is configured to exclude duplications of the sampling timing information.

5. The data compression device according to claim 1, wherein the grouping circuit is further configured to make changes of the first sampling rate or the second sampling rate so that the difference between the least common multiple and the first sampling rate becomes equal to or smaller than the predetermined threshold value and the difference between the least common multiple and the second sampling rate becomes equal to or smaller than the predetermined threshold value.

6. The data compression device according to claim 5, wherein the grouping circuit is configured to make the changes of the first sampling rate or the second sampling rate by raising the sampling rate.

7. The data compression device according to claim 5, wherein the grouping circuit is further configured to record the changes of the sampling rate.

8. A data compression method comprising:
   grouping a plurality of kinds of data series with different sampling rates, and compressing the grouped data series,
   grouping a first data series obtained by being sampled at a first sampling rate and a second data series obtained by being sampled at a second sampling rate,
   wherein a difference between the least common multiple of the first sampling rate and the second sampling rate and the first sampling rate is equal to or smaller than a predetermined threshold value, and a difference between the least common multiple and the second sampling rate is equal to or smaller than the predetermined threshold value.

9. A data compression device comprising:
a grouping circuit configured to group a plurality of kinds of data series with different sampling rates that comprise sensing data about biological information; and
a compression circuit configured to compress the data series grouped by the grouping circuit,
wherein the grouping circuit is configured to group a first data series obtained by being sampled at a first sampling rate and a second data series obtained by being sampled at a second sampling rate, and
wherein a difference between the least common multiple of the first sampling rate and the second sampling rate and the first sampling rate is equal to or smaller than a predetermined threshold value, and a difference between the least common multiple and the second sampling rate is equal to or smaller than the predetermined threshold value.

10. The data compression device according to claim 9, wherein the grouping circuit is configured to group a first data series sampled at a sampling rate f1 and a second data series sampled at a sampling rate f2, and creates a data series with a sampling rate fx containing sampling data of the first data series and sampling data of the second data series by complementing dummy data, wherein the compression circuit is configured to compress the sampling data of the created data series by M pieces, and
wherein fx is the least common multiple of f1 and f2, M is a value that is N times fx, and N is an integer of 1 or more.

11. The data compression device according to claim 9, wherein the grouping circuit is configured to repeat the grouping by further adding other kinds of data series with different sampling rates to the grouped data series.

12. The data compression device according to claim 9, wherein the grouping circuit is further configured to make changes of the first sampling rate or the second sampling rate so that the difference between the least common multiple and the first sampling rate becomes equal to or smaller than the predetermined threshold value and the difference between the least common multiple and the second sampling rate becomes equal to or smaller than the predetermined threshold value.

13. The data compression device according to claim 12, wherein the grouping circuit is configured to make the changes of the first sampling rate or the second sampling rate by raising the sampling rate.

14. The data compression device according to claim 12, wherein the grouping circuit is configured to record the changes of the sampling rate.

* * * * *